United States Patent [19]

Hutson

[11] 3,896,477

[45] July 22, 1975

[54] MULTILAYER SEMICONDUCTOR SWITCHING DEVICES

[76] Inventor: Jearld L. Hutson, 907 Newberry, Richardson, Tex. 75080

[22] Filed: Nov. 7, 1973

[21] Appl. No.: 413,558

[52] U.S. Cl. ...................... 357/39; 357/20; 357/38; 357/45; 357/55; 357/49; 357/86; 357/89

[51] Int. Cl. ........................................... H01e 11/10

[58] Field of Search ............... 317/235 AE, 235 AB; 357/20, 38, 39, 45, 55, 49, 86, 89

[56] References Cited

UNITED STATES PATENTS

| | | | |
|---|---|---|---|
| 3,277,352 | 10/1966 | Hubner | 317/234 |
| 3,360,696 | 12/1967 | Neilson et al. | 317/235 |
| 3,437,889 | 4/1969 | Eugster | 317/235 |
| 3,476,992 | 11/1969 | Chu | 317/235 |
| 3,476,993 | 11/1969 | Aldrich et al. | 317/235 |
| 3,608,186 | 9/1971 | Hutson | 317/235 UX |
| 3,622,845 | 11/1971 | McIntyre et al. | 357/38 |
| 3,634,739 | 1/1972 | Borchert et al. | 357/38 |
| 3,792,320 | 2/1974 | Hutson | 357/39 |
| 3,794,890 | 2/1974 | Weimann et al. | 317/235 R |

*Primary Examiner*—Andrew J. James
*Assistant Examiner*—Joseph E. Clawson, Jr.
*Attorney, Agent, or Firm*—Richards, Harris & Medlock

[57] ABSTRACT

The specification discloses a semiconductor device including at least three layers of one and the opposite conductivity type of semiconductor material interleaved with one another to form P-N junctions within the body. A plurality of discrete regions of one conductivity type are formed in each of the exterior layers of the other conductivity type and extend normally from the external surfaces into the interiors of each of the exterior layers. The discrete regions are closely spaced apart throughout the surface of the exterior layers and the discrete regions in one layer are aligned with the discrete regions in the other layer to cause voltage drops adjacent the discrete regions which are normal to the P-N junctions during initial conduction of the device. First and second spaced apart electrodes are connected in low resistance ohmic contact with the discrete regions and one of the exterior layers. A third electrode is connected to the other of the exterior layers of the other conductivity type.

30 Claims, 6 Drawing Figures

MULTILAYER SEMICONDUCTOR SWITCHING DEVICES

FIELD OF THE INVENTION

This invention relates to semiconductor switching devices, and more particularly relates to a multiterminal semiconductor switching device of the multilayer type.

THE PRIOR ART

Semiconductor switching devices having five alternating regions of opposite semiconductor conductivity types and four P-N rectifying junctions have been heretofore utilized to provide full wave power control of alternating current. These semiconductor devices, commonly termed semiconductor triacs, are described in detail in such patents as U.S. Pat. No. 3,275,909 issued to Gutzwiller on Sept. 27, 1966. An important aspect of operation of such semiconductor triac devices is a lateral voltage drop which occurs along the emitter junction in order to trigger conduction of the device when the proper amount of current is applied through the gate electrode. This lateral voltage drop occurs as a result of the nonuniform geometry of such prior triac devices, wherein the upper and lower emitter regions are laterally offset from one another. The lateral voltage drop occurrence is described in detail in column 5 of U.S. Pat. No. 3,275,909, in column 4 of U.S. Pat. No. 3,476,993, and in column 4 of U.S. Pat. No. Re 27,120.

The lateral voltage drops which occur during operation of prior devices having nonuniform emitter geometry result in a high absolute current density for the devices, due to the fact that the majority of the voltage drop occurs in one localized lateral area of the device. Such previously developed triac devices having lateral voltage drops thus often have lower than optimum static and commutating dv/dt and often have turnoff times which are longer than desired.

SUMMARY OF THE INVENTION

In accordance with the present invention, a semiconductor triac device is provided which substantially reduces or eliminates many of the disadvantages heretofore associated with prior multilayer semiconductor triac devices. In the present invention, the localized lateral voltage drop of prior triac switching devices is substantially eliminated and a voltage drop is provided which extends over the entire area of a device perpendicularly to the emitter junctions of the device in order to provide improved operational characteristics.

In accordance with a more specific aspect of the invention, a semiconductor device is provided which includes a body of semiconductor material having at least three layers including an internal layer of one conductivity type bounded on opposite sides by two layers of the opposite conductivity type to form a plurality of P-N junctions. The body includes first and second opposed outer surfaces of the opposite conductivity type. A plurality of discrete regions of one conductivity type are closely spaced apart over the first and second outer surfaces of the body, the discrete regions having generally symmetrical cross sections and extending inwardly from the first and second outer surfaces into the layers of opposite conductivity type. The discrete regions in the first outer surface are laterally aligned with the discrete regions in the second outer surface. A first electrode is placed in low resistance ohmic contact with the exposed surface of a plurality of discrete regions and with a portion of the first outer surface. A second electrode is connected to the first outer surface and is spaced apart from the first electrode. A third electrode is connected to the second outer surface. In one embodiment of the invention, a fourth electrode is spaced apart from the third electrode on the second outer surface.

In accordance with another aspect of the invention, a semiconductor device includes a body having three layers of one and the opposite conductivity type of semiconductor material. A layer of one conductivity type is disposed between exterior layers of the other conductivity type to form two P-N junctions within the body. A plurality of discrete regions of the one conductivity type are formed in both of the exterior layers and extend normally from the external surfaces into the interiors of the exterior layers. The discrete regions of one exterior layer are laterally aligned with the discrete regions of the other exterior layer, and the discrete regions are closely spaced apart throughout the exterior layers to cause voltage drops adjacent the regions which are normal to the P-N junctions during initial conduction of the device. First and second spaced apart electrodes are connected in low resistance ohmic contact with the discrete regions and one of the exterior layers. A third electrode is connected to the other of the exterior layers of the other conductivity type.

DESCRIPTION OF THE DRAWINGS

For a more complete understanding of the present invention and for further objects and advantages thereof, reference is now made to the following description taken in conjunction with the following Drawings, in which.

DESCRIPTION OF THE PREFERRED EMBODIMENT

Figure 1:
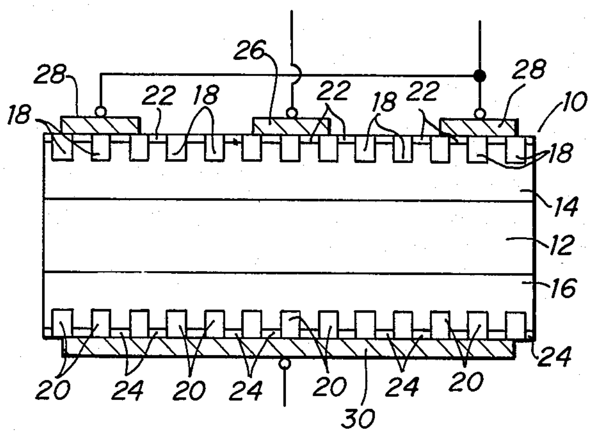
FIG. 1 is a somewhat diagrammatic sectional view of one embodiment of a semiconductor switching device according to the invention.

FIG. 1 illustrates a side view of an embodiment of a three terminal semiconductor triode-type device constructed in accordance with the invention. A body 10 includes an interior layer of N-type conductivity material 12 which is surrounded by two exterior layers of P-type material 14 and 16. The geometry of the body 10 may be either rectilinear or circular, and a plurality of discrete N-type regions 18 are formed throughout the surface area of layer 14 and a plurality of N-type discrete regions 20 are formed throughout the surface area of layer 16. In the illustrated embodiment, each of the regions 18 and 20 are the same general size and have a symmetrical cross section which in the illustrated embodiment is substantially square.

A thin layer 22 of P+ material is disposed over the exterior surface of layer 14 and completely surrounds and isolates the upper regions of each of the regions 18. Similarly, a thin layer of P+ material 24 is formed over the exterior surface of layer 16 and completely surrounds and isolates the upper portions of each of the discrete regions 20. The P+ layers 22 and 24 have high resistivities relative to regions 18 and 20 and thus tend to isolate the regions 18 and 20 from adjacent regions. A first metal electrode 26 is formed in the center of one side of the body 10 and contacts the layer 22 and several of the regions 18. A second electrode 28, which in the illustrated position comprises a unitary electrode which surrounds the centrally located electrode 26, is also connected to the layer 22 and the upper portions of ones of the regions 18. A third electrode 30 is placed in low ohmic resistance contact with substantially the entire surface of the opposite side of the body 10 and contacts layer 24 and the upper portions of the discrete regions 20.

An important aspect of the invention is that the electrodes 26 and 28 are spaced apart a sufficient distance in order to isolate the electrodes from one another. In the preferred embodiment, the electrodes 26 and 28 are spaced apart by at least one of the intervals of P-type and P+-type material which separates adjacent discrete regions 18, or at least by one of the vertical P-N junctions formed by the regions 18 and the layers 14 and 22. Generally, it will be desirable to separate the electrodes 26 and 28 by three or four of the discrete regions 18.

A very important aspect of the invention illustrated in FIG. 1 is that the regions 18 are vertically aligned over the discrete regions 20. In other words, the longitudinal axis of each of the regions 18 is directly aligned with the longitudinal axis of one of the regions 20. As will be subsequently described in greater detail, this alignment of the regions 18 and 20 substantially eliminates lateral current flow during initial conduction of the device and insures that voltage drops which occur within the device are perpendicular to the P-N junctions formed by the layers 12, 14 and 16. This aligned or opposed emitter structure differs from prior triac devices wherein the emitters are nonaligned or nonopposed, thus resulting in lateral current flow.

Figure 2:
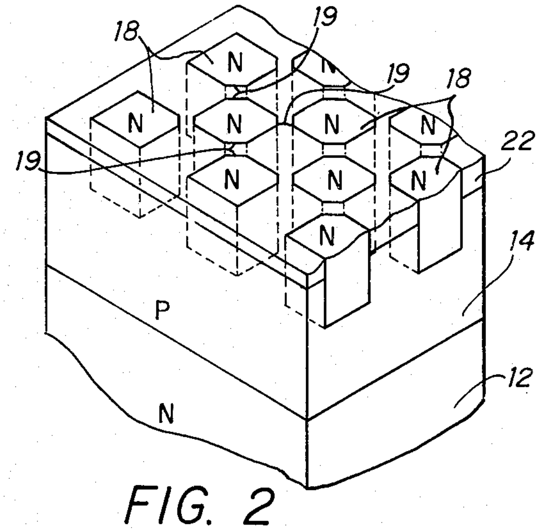
FIG. 2 is an enlarged perspective view of a cut-away portion of the upper layers of the device shown in FIG. 1.

FIG. 2 illustrates a perspective view of a plurality of the discrete regions 18 and illustrates the preferred generally square cross sectional shape of the regions 18. The electrodes 26 and 28 are removed from FIG. 2 for clarity of illustration. FIG. 2 also illustrates how the layer 22 spaces apart and surrounds the upper portions of each of the regions 18 in order to provide isolation to the regions 18. As may be seen in FIG. 2, the exterior faces of each of the regions 18 are flush with the exterior surfaces of the layer 22. The regions 18 include beveled corners 19 in order to separate adjacent regions with P-type material. The regions 20 are formed in an identical manner as regions 18, and are directly vertically aligned or opposed with regions 20.

Figure 3:
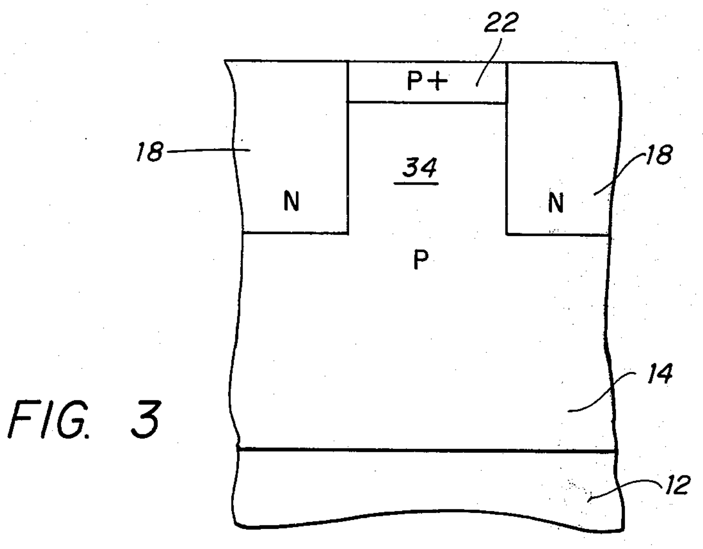
FIG. 3 is an enlarged sectional view taken between two of the discrete regions of the device shown in FIG. 1.

FIG. 3 is a sectional view taken between adjacent N-type regions 18 and illustrates how the regions 18 are separated by a thin interval 34 of P-type material. FIG. 3 also illustrates the thin layer 22 of P+ material which covers the exterior of the layer 14. FIG. 3 further shows how the regions 18 extend from the exterior surface of the body 10 downwardly into the interior of layer 14, but do not extend past the P-N junction formed by layers 12 and 14.

The device illustrated in FIGS. 1–3 may be formed by any one of a number of conventional techniques. For example, a pellet of silicon of N conductivity type may be boron or gallium diffused on both sides to a depth of 1 mil to 4 mils to form the P-type layers 14 and 16. The pellet may then be masked on both sides by conventional masking techniques, as for example, with silicon dioxide. A portion of the dioxide mask may then be removed on the exterior surfaces of the pellets to expose a plurality of spaced apart rectangular surfaces corresponding to the cross sections of the regions 18 and 20. Care is taken during this operation that the regions 18 and 20 are directly opposed with one another in the manner previously described. The pellet may then be exposed to phosphorus diffusion to a depth of several mils in order to form the N-type discrete regions 18 and 20. Appropriate metal contacts may then be applied by conventional techniques to form the electrodes 26, 28 and 30. For example, the electrodes may be formed by deposition of electroless nickle or aluminum.

If desired, an identical structure but with opposite conductivities as shown in FIGS. 1–3 may be formed by similar techniques. However, it is believed that such a complementary device will not generally provide the superior operating characteristics previously described with the use of N-type emitting regions. In the formation of such a complementary device, the initial wafer or pellet would be of P-type conductivity material which would form the interior layer. The upper and lower N-type layers would then be diffused by an impurity such as phosphorous. Finally, a mask would be applied and the discrete regions would be diffused by boron or gallium diffusion. Contacts would then be applied by conventional techniques such as described above.

The regions 18 and 20 are formed to be less than twenty five mils in width, with a width of less than ten mils preferred, and are spaced very close to one another. For example, regions 18 and 20 will generally be spaced apart within a range of 1 mil to 10 mils, with a spacing of 2 mils to 3 mils working well in practice. The length of the regions 18 and 20 are such that they extend into the interior of layers 14 and 16, but do not extend through the layers 14 and 16.

The surface impurity concentrations of the regions 18 and 20 and layers 12, 14 and 16 may, of course, vary according to desired operation of the device. However, a typical impurity concentration of the P+ layers 22 and 24 is on the order of $2 \times 10^{19}$ atoms per cubic centimeter and a typical depth of the layers 22 and 24 is on the order of 0.2 mil. P-type layers 14 and 16 may have a surface impurity concentration of on the order of $10^{16} - 10^{21}$ atoms per cubic centimeter. The N-type layer 12 may, for example, have a surface impurity concentration of in the range of $10^{13} - 10^{15}$ atoms per cubic centimeter. The N-type discrete regions 18 and 20 may for example have a surface impurity concentration of $10^{21}$ atoms per cubic centimeter. The depth of layers 14 and 16 may, for example, be up to 4 mils, with the depth of the N-type regions 18 and 20 being less than the thickness of the layers 14 and 16.

Operation of the semiconductor triode-type device shown in FIGS. 1–3 is somewhat similar to that of the devices disclosed in the Gutzwiller U.S. Pat. No.

3,275,909 noted above, except that the current flow and resulting voltage drop along the emitter junction of the present device is predominately perpendicular to the lateral P-N junction between layers 12 and 14, rather than parallel to the lateral emitter junctions as in the prior art devices disclosed in the Gutzwiller patent. In operation when suitable voltage is applied across the electrodes of the present device, voltage drops will occur in the area of the discrete regions 18. These voltage drops are primarily directed perpendicular to the P-N junction formed by layers 12 and 14 and are generally parallel to the longitudinal axes of the regions 18. These voltage drops will therefore henceforth be termed "vertical voltage drops" as opposed to the prior art "lateral voltage drops." As the applied voltage is raised to a higher value to force conduction through the center junctions, carriers from the upper emitter regions 18 cause vertical voltage drops to occur in the area of the lower emitter regions 20. As the regions 20 are directly aligned with regions 18, carriers may travel from an upper emitter region to a lower emitter region in a generally vertical direct path. The lower emitter regions can thus very efficiently be caused to emit over the entire surface area of the device, and due to the opposed geometry and relatively narrow emitter regions, lateral current flow is essentially eliminated in the device.

As noted, the present device conducts over substantially the entire area of the device and thus has lower absolute current density than previously developed triacs which have lateral voltage drops which are concentrated in localized areas of the devices. Because of the elimination of lateral voltage drops and reduced absolute current density, the present triac devices thus have substantially improved switching speeds and improved static and commutating dv/dt characteristics. In fact, the current density of the present device may be as much as one-half the current density of an equivalent prior triac, and the switching time of the present device may be as much as one-half the switching time of a similar prior triac. Further, the forward current during surge which is possible before failure in the present device is as much as 25–50% greater than prior devices, due to the dissipation of heat over substantially the entire surface of the device.

Figure 4:
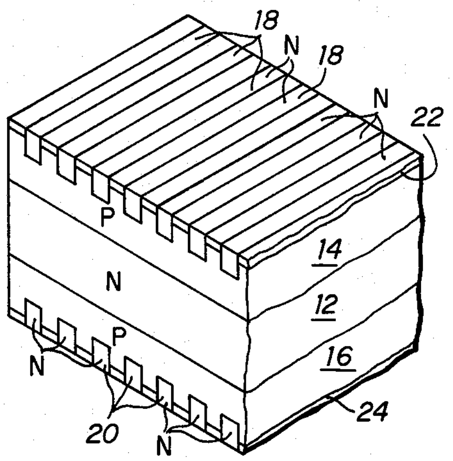
FIG. 4 is a cut-away view of an alternate embodiment of the invention.

Although the preferred embodiment is illustrated with discrete regions 18 and 20 having generally square cross sections, it will be understood that different configurations of the emitter regions are possible. For example, FIG. 4 illustrates a device having a plurality of elongated bar upper discrete regions 18 which are directly aligned or opposed with elongated bar lower discrete regions 20. Regions 18 are provided with rectangular cross sections, but are formed as elongated bars and are spaced apart from one another in a parallel configuration. Regions 20 are identical in size with regions 18 and are directly aligned below regions 18, in order to provide the advantages previously described. The dimensions of the device of FIG. 4 are the same as the dimensions previously described for FIGS. 1–3.

Side gate structure is formed in the device by the application of electrodes over groups of the regions 18 and 20. Other configurations of the discrete regions are also possible, such as a plurality of spaced apart concentric circles, wavy elongated bars, and the like.

Figure 5:
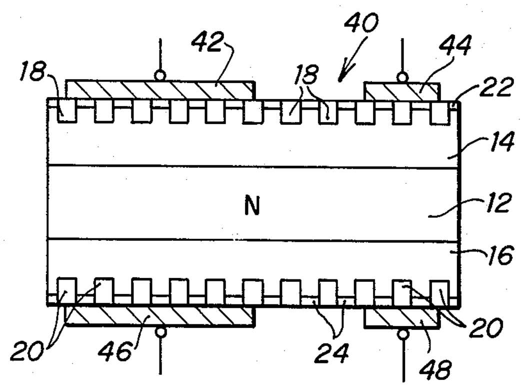
FIG. 5 is a somewhat diagrammatic side sectional view of a four terminal embodiment of the device.
Figure 6:
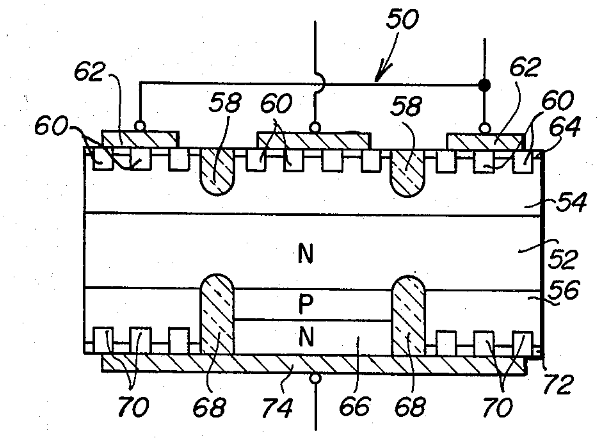
FIG. 6 is a side sectional view of a third embodiment constructed according to the invention.

FIG. 5 illustrates another embodiment of the invention wherein like numerals are utilized for like and corresponding parts of previous drawings. The device is designated generally by the numeral 40 and is substantially identical to the device shown in FIG. 1, except for the addition of a fourth electrode. N-type layer 12 surrounded by P-type layers 14 and 16. Discrete regions 18 are formed on one surface of the body 40 and discrete regions 20 are formed in the other surface of the body as previously described, and are aligned beneath regions 18. Thin layers of P+ material 22 and 24 are formed on exterior sides of the body and surround the discrete regions 18 and 20 as previously noted. Electrodes 42 and 44 are spaced apart on one side of the device 40, while third and fourth electrodes 46 and 48 are spaced apart on the opposite side of the device 40. As previously noted, the electrodes 42 and 44 and 46 and 48 are spaced apart by at least one interval of P-type and P+ type material and preferably are spaced apart by a plurality of regions 18 and 20. Operation of the device shown in FIG. 5 is similar to previously developed four terminal five layer devices, except that the voltage drops which occur during conduction of the device are vertical, i.e., are primarily directed perpendicularly to the P-N junctions formed by layers 12, 14 and 16. FIG. 6 illustrates a third embodiment of the invention and is generally denoted by the numeral 50. Device 50 includes a N-type layer 52 which is surrounded on opposite sides thereof by a P-type conductivity layer 54 and layer 56. A groove 58 surrounds a first electrode 60 connected to one side of the device 50. Groove 58 is preferably filled with passivating material such as glass or the like. A plurality of discrete regions of N-type material 60 are formed throughout the surface area of the device in the manner previously described. A continuous electrode 62 contacts ones of the regions 60 and is spaced apart from electrode 60. A thin layer of P+ material 64 is formed over the layer 52 and surrounds the upper portions of the regions 60.

A region 66 of N-type material is formed in the center region of the layer 56 and is completely surrounded by a groove 68 filled with passivating material such as glass. A plurality of discrete regions 70 of N-type material are formed in layer 56 in the manner previously described. A thin layer of P+ material 72 is formed over layer 56 and surrounds the upper portions of regions 70 in the manner previously described. A third electrode 74 contacts the exterior surfaces of the regions 70 and the P+ layer 72.

Operation of the device shown in FIG. 6 is similar to known devices of this general type, in that the inversion region 66 tends to maintain the center gate region of the device in a nonconducting state. In operation of the device 50, the regions 60 are aligned with regions 70 in the manner previously described, and thus no lateral current flow or resulting voltage drop occurs in device 50 during operation. Only vertical voltage drops occur in the area of the regions 60 and 70 as previously noted. As described above, this provides substantially improved operating characteristics such as improved static and commutating dv/dt and reduced turn on time.

Whereas the present invention has been described with respect to specific embodiments thereof, it will be understood that various changes and modifications will be suggested to one skilled in the art, and it is intended to encompass such changes and modifications as fall within the scope of the appended claims.

What is claimed is:

1. A semiconductor device comprising:

a body of semiconductor material having at least three layers including an internal layer of one conductivity type bounded on opposite sides by two layers of the opposite conductivity type to form a plurality of P-N junctions, said body having first and second opposed outer surfaces of said opposite conductivity type, an array of discrete regions of said one conductivity type spaced apart over said first and second outer surfaces of said body; the cross sections of said discrete regions parallel to said outer surfaces being symmetrical and said discrete regions extending inwardly from said first and second outer surfaces into the interior of said layers of opposite conductivity type, each of said discrete regions in said first outer surface being vertically aligned with a discrete region in said second outer surface, in order to substantially eliminate lateral current flow in said device during conduction upon the application of predetermined bias potential, a first electrode in low resistance ohmic contact with the exposed surfaces of a plurality of said discrete regions and with a portion of said first outer surface, a second electrode connected to a source of control bias and connected to said first outer surface and contacting a plurality of said discrete regions and spaced apart from said first electrode, and a third electrode connected to said second outer surface.

2. The semiconductor device of claim 1 wherein the entire surface area of said layers of opposite conductivity type conducts during triggering of said device when predetermined bias potential is applied to said electrodes.

3. The semiconductor device of claim 1 wherein a voltage drop occurs adjacent said regions which is normal to said outer surfaces during conduction of said device after a predetermined bias potential is applied to said electrodes.

4. The semiconductor device of claim 1 and further comprising a layer of highly doped semiconductor material of said opposite conductivity type formed over said first and second outer surfaces of said body and extending between said discrete regions to provide isolation thereto, the thickness of said highly doped semiconductor material being less than the thickness of said three layers.

5. The semiconductor device of claim 1 wherein the cross sectional areas of said regions parallel to said surfaces are generally rectangular and said regions are spaced apart over the entire area of said first and second outer surface, with intervals of opposite conductivity type disposed between and surrounding each of said regions.

6. A semiconductor device of claim 1 wherein said regions are elongated and have their lengths disposed normal to said outer surfaces, and wherein said regions are spaced about the outer surfaces of the body in a predetermined symmetrical array.

7. The semiconductor device of claim 1 and further comprising a groove disposed between said first and second electrodes.

8. The semiconductor device of claim 1 and further comprising a fourth electrode spaced apart from said third electrode on said second outer surface.

9. The semiconductor device of claim 1 wherein said regions are comprised of N-type conductivity material.

10. The semiconductor device of claim 9 and further comprising a layer of P+ semiconductor material disposed over said first and second outer surfaces and surrounding said discrete regions.

11. A semiconductor device comprising:

a body including three layers of alternating opposite conductivity types of semiconductor material, a layer of one conductivity type being disposed between exterior layers of the other conductivity type to form two P-N junctions within said body, an array of discrete regions of said one conductivity type formed in both of said exterior layers and extending normally from the external surfaces into the interiors of said exterior layers, said discrete regions being spaced apart throughout said exterior layers and regions in one exterior layer being directly vertically aligned with regions in the other exterior layer to cause a voltage drop adjacent said regions normal to said P-N junctions during initial conduction of said device upon the application of a predetermined bias potential, first and second spaced apart electrodes connected in low resistance ohmic contact each with a plurality of said discrete regions and one of said exterior layers, a source of control bias connected to said second electrode, and at least a third electrode connected to the other of said exterior layers of the other conductivity type.

12. The semiconductor device of claim 11 wherein said discrete regions are elongated and wherein each discrete region in one of said exterior layers is aligned along its longitudinal axis with the longitudinal axis of a discrete region in the other of said exterior layers.

13. The semiconductor device of claim 12 wherein the entire surface of said exterior layers conducts during triggering of said device.

14. The semiconductor device of claim 11 and further comprising a thin layer of semiconductor material of said other conductivity type having a higher resistivity than said discrete regions disposed over said external surface of said exterior layers and surrounding said discrete regions.

15. The semiconductor device of claim 14 wherein said thin layer of semiconductor material comprises P+ type material.

16. The semiconductor device of claim 11 wherein said discrete regions are separated from one another by thin intervals of said other conductivity type and wherein said first and second electrodes are spaced apart by at least one of said intervals.

17. The semiconductor device of claim 11 wherein the cross sections of said regions are generally square and have a thickness of less than 10 mils, the lengths of said regions being directed normal to said external surfaces of said exterior layers.

18. The semiconductor device of claim 11 and further comprising a groove in said exterior layer separating said first and second electrodes.

19. The semiconductor device of claim 18 and further comprising a groove surrounding a central area on said other of said exterior layers.

20. A semiconductor device of claim 11 and further comprising a fourth electrode spaced apart from said third electrode on said other of said exterior layers.

21. A semiconductor device comprising:

a body of semiconductor material including a plurality of interleaved layers of opposite semiconductor material type to form a plurality of P-N junctions, an array of substantially identical discrete regions of semiconductor material of one conductivity type formed in two opposite exterior layers each of the opposite conductivity type, said regions having generally symmetrical cross sections with thicknesses less than 25 mils, said discrete regions extending from the external surfaces normally into the interiors of said layers, said regions being closely spaced apart over the surface areas of said exterior layers with intervals of said opposite conductivity type disposed between and surrounding said regions, the axes of said discrete regions in one of said exterior layers being aligned with the axes of said discrete regions in the other of said exterior layers, first and second electrodes contacting one of said exterior surfaces and each contacting a plurality of said regions and spaced apart by at least one of said intervals of said opposite conductivity type, a source of control bias connected to said second electrode, and a third electrode connected to the other exterior layer of semiconductor material of said body.

22. The semiconductor device of claim 21 and further comprising a thin layer of semiconductor material of said opposite conductivity type having a higher resistivity than said discrete regions disposed over said external surface and surrounding said discrete regions.

23. The semiconductor device of claim 21 wherein said thin layer of semiconductor material comprises P+ material.

24. The semiconductor device of claim 21 wherein a voltage drop occurs along the lengths of said regions which is parallel to the longitudinal axes of said regions during initial conduction of said devices upon application of a predetermined bias potential.

25. The semiconductor device of claim 21 and further comprising a groove separating said first and second electrodes.

26. The semiconductor device of claim 21 wherein said first and second electrodes are spaced apart by at least one interval of said other conductivity type.

27. The semiconductor device of claim 21 and further comprising a fourth electrode spaced apart from said third electrode.

28. The semiconductor device of claim 21 wherein said first electrode is disposed in the center of said exterior surface and is separated by said second electrode by a groove, and a groove formed in said other exterior layer to define a center area aligned with said first electrode.

29. The semiconductor device of claim 28 wherein said center area comprises said one conductivity type.

30. The semiconductor device of claim 29 wherein said grooves are filled with passivating material.

* * * * *